(12) United States Patent
Kwan et al.

(10) Patent No.: US 7,306,082 B2
(45) Date of Patent: Dec. 11, 2007

(54) PASSIVE DAMPING OF VIBRATIONS IN A SUPPORT STRUCTURE

(75) Inventors: Ka Shing Kenny Kwan, Singapore (SG); Srikanth Narasimalu, Singapore (SG); Murali Saranagapani, Singapore (SG); Sathish Kumar Balakrishnan, Singapore (SG)

(73) Assignee: ASM Technology Singapore PTE LTD., Singapore (SG)

( * ) Notice: Subject to any disclaimer, the term of this patent is extended or adjusted under 35 U.S.C. 154(b) by 0 days.

(21) Appl. No.: 10/410,823

(22) Filed: Apr. 8, 2003

(65) Prior Publication Data

US 2004/0201148 A1    Oct. 14, 2004

(51) Int. Cl.
   *F16F 7/10*    (2006.01)
(52) U.S. Cl. ........................... 188/378; 267/137
(58) Field of Classification Search ................ 188/378; 267/139, 141; 248/638, 678, 562
   See application file for complete search history.

(56) References Cited

U.S. PATENT DOCUMENTS

| 4,419,480 A | * | 12/1983 | Tabar et al. ................. 524/525 |
|---|---|---|---|
| 4,706,788 A | * | 11/1987 | Inman et al. ................ 188/378 |
| 4,836,516 A | * | 6/1989 | Wycech ....................... 267/279 |
| 5,855,260 A | * | 1/1999 | Rubin .......................... 188/379 |
| 6,235,400 B1 | * | 5/2001 | Natsubori et al. ........... 428/468 |
| 6,298,963 B1 | * | 10/2001 | Kim ............................ 188/379 |
| 6,381,196 B1 | * | 4/2002 | Hein et al. ..................... 367/1 |
| 2003/0013322 A1 | * | 1/2003 | Choy et al. ................. 438/800 |

FOREIGN PATENT DOCUMENTS

JP    4-335541    * 11/1992

* cited by examiner

*Primary Examiner*—Bradley King
(74) *Attorney, Agent, or Firm*—Ostrolenk, Faber, Gerb & Soffen, LLP

(57) ABSTRACT

A support structure supporting a movable component is provided with a vibration damper in the form of at least one cavity in the structure, the cavity being filled with a composite material; preferably a composite material of about 80% butyl rubber and 20% carbon particles. The composite material is preferably bonded to the cavity walls by adhesive or mechanically coupled by a texture on the cavity walls. The rubber composite may be first moulded then inserted into the cavity or may be injected into the cavity and moulded by the cavity. The cavities may be provided with a vent to facilitate insertion or injection of the composite material.

36 Claims, 6 Drawing Sheets

PASSIVE DAMPING OF VIBRATIONS IN A SUPPORT STRUCTURE

FIELD OF INVENTION

This invention relates to a method and an apparatus for reducing or damping mechanical vibrations by passive means.

BACKGROUND

The invention has application to the reduction of vibrations in mechanical components that undergo acceleration in use, for example in the mechanical positioning of a process head in different directions in the manufacture of semiconductor devices where high accuracy is required.

One such manufacturing process is wire bonding, where a machine moves a wire bonding head in orthogonal X, Y and Z directions, under programmed computer control, to successively position and then attach and electrically connect a series of wired connections between contact pads on semiconductor wafers and corresponding connection points on their associated supporting lead frames.

In known bondhead assemblies, there are many vibration peaks observed in the frequency response function due to various resonances of individual mechanical components and in the overall system. Resonances from the bondhead can pass to an XY table assembly adapted to move the bondhead along X- and Y-axes, and adversely affect its performance. In particular, the wirebonder exhibits many resonances in the Z-axis due to components such as the wireclamp and ultrasonic transducer. These vibrations can limit or degrade the accuracy or repeatability of the positioning of the head, and therefore the integrity and reliability of the wire bonds. This limits the speed at which the wire bonding machine can be satisfactorily operated.

SUMMARY OF INVENTION

It is an object of the invention to dampen vibrations in a support structure supporting a movable component.

In one aspect the invention may be broadly said to be a support structure having a vibration damper, the vibration damper being provided by at least one cavity in the support structure, the at least one cavity being at least partially filled with a composite material.

In a second aspect the invention may be broadly said to be a method of damping vibrations in a support structure, the method including the steps of providing the structure with one or more cavities, at least partially filling at least one of the cavities with a composite material.

Preferably, in respect of either aspect, the composite material includes butyl rubber loaded with carbon particles.

Preferably, in respect of either aspect, not more than 60% of the weight of the composite material is carbon particles.

More preferably, in respect of either aspect, approximately 20% of the weight of the composite material is carbon particles.

Preferably, in respect of either aspect, a suitable position for the cavity is determinable using finite element analysis, such that the cavity may be located at a position of the support structure with relatively fewer lines of force flowing through the structure, and the cavity may be located at a position of the support structure with a relatively higher level of strain.

Preferably, in respect of either aspect, the composite material is bonded to the cavity walls.

More preferably, in respect of either aspect, the composite material is bonded to the cavity walls by an adhesive material.

Alternatively, in respect of either aspect, the cavity walls are provided with a surface texture and the composite material is bonded to the cavity walls by engaging the surface texture on the cavity walls.

Preferably, in respect of either aspect, the at least one cavity is completely filled with the composite material.

Preferably, in respect of either aspect, the at least one cavity is a cylindrical hole in the support structure.

Preferably, in respect of either aspect, the at least one cavity is a drilled hole in the support structure.

Preferably, in respect of either aspect, the at least one cavity is an open cavity.

Preferably, in respect of either aspect, the at least one cavity is filled with a composite material that is first cast as a cylindrical rod and then inserted into the respective cavity.

Preferably, in respect of either aspect, the composite material is injected in a fluent state into the at least one cavity which acts as a mould to form the shape of the composite material which solidifies in the cavity.

Preferably, in respect of either aspect, the at least one cavity is provided with a vent aperture allowing the escape of air from the cavity during the injection or insertion of the composite material into the cavity.

Preferably, in respect of either aspect, the support structure is a wirebonder bracket.

The invention may further be said to consist in any alternative combination of parts or features mentioned herein or shown in the accompanying drawings. Known equivalents of these parts or features which are not expressly set out are nevertheless deemed to be included.

BRIEF DESCRIPTION OF DRAWINGS

Preferred forms, systems and methods of performing the invention will be further described with reference to the accompanying figures by way of example only and without intending to be limiting, wherein.

DETAILED DESCRIPTION OF PREFERRED EMBODIMENT(S)

The invention will be described by reference to a wirebonder having a bondhead moveable in three orthogonal axes under programmed computer control. As noted above wirebonders are used to make wired electrical connections between contact pads on semiconductor wafers and corresponding connection points on associated supporting lead frames. Because of the many resonances appearing in the Z-axis of the wirebonder, the final accuracy of wire bonding can be improved by damping vibrations in the bondhead or Z-axis assembly.

Figure 1:
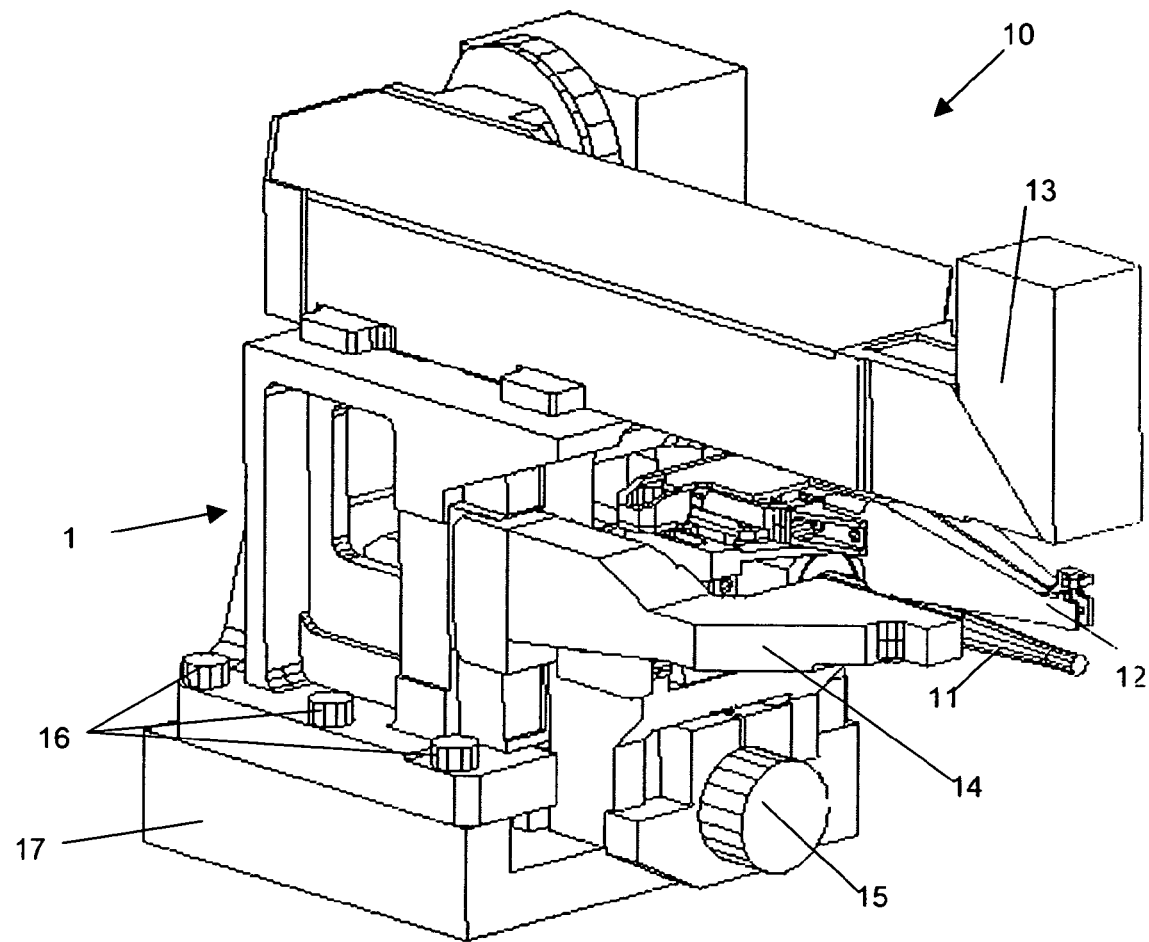
FIG. 1 shows a perspective view of a bondhead assembly of a wire bonder.

FIG. 1 shows a perspective view of a bondhead assembly 10 of a wire bonderi. The bondhead assembly 10 includes a support bracket 1 that is affixed to a support base 17 by screws 16. There are a variety of components mounted onto the support bracket 1, including a Z axis carriage which supports an ultrasonic transducer 11 for performing ultrasonic bonding, a wire clamp assembly 12 to feed bonding wire to the bonding site and a electrical discharge arm 14 to provide electrical sparks required during wire bonding. A camera 13 mounted on top of the support bracket 1 enables an operator to manually monitor and control a wire bonding process. An induction sensor 15 electronically monitors the bonding process.

Figure 2:
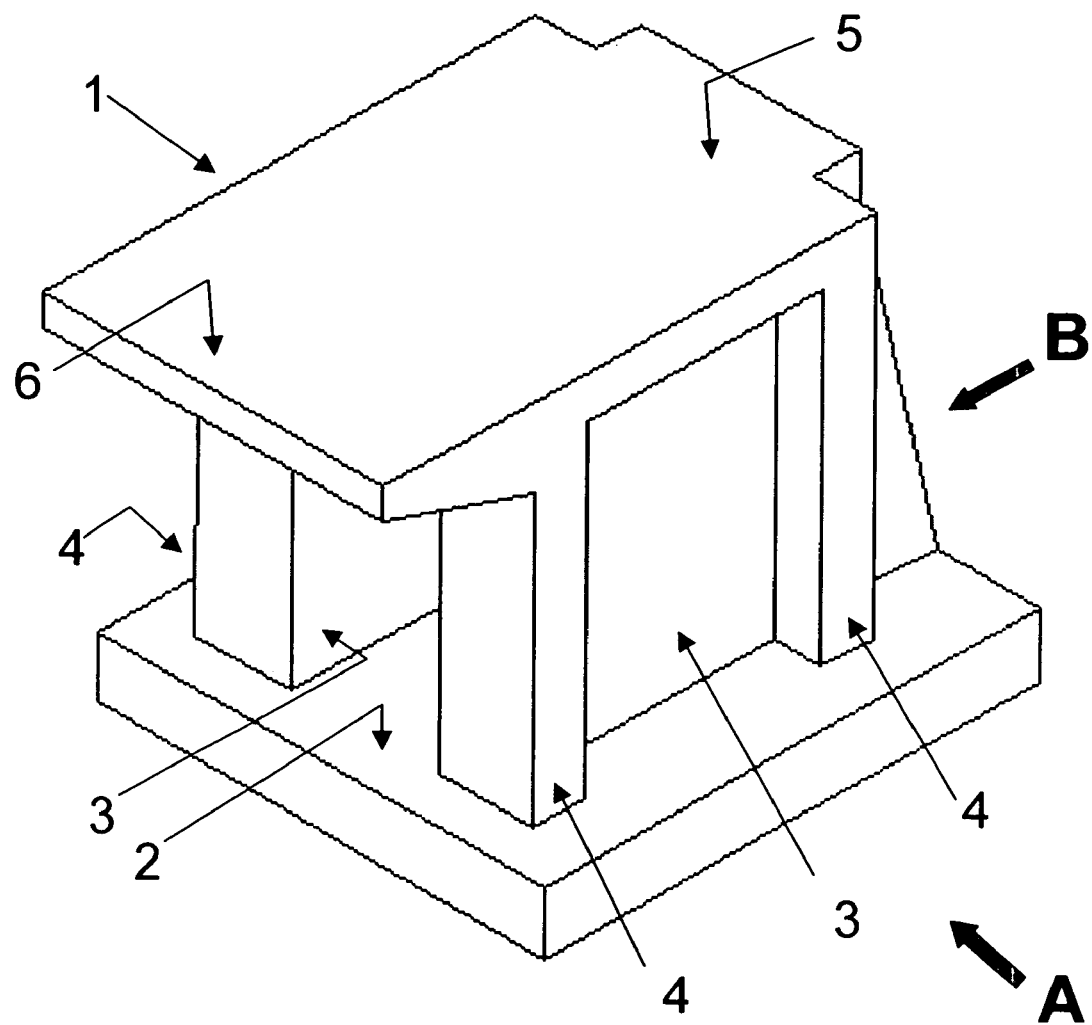
FIG. 2 shows a perspective view of a simplified form of a wire bonder bondhead bracket.

FIG. 2 shows a perspective view of a simplified form of a wire bonder bondhead bracket. In use, the support bracket 1 is carried on an XY table and supports a Z axis carriage which supports wire clamping 12 and bonding 11 assemblies or other components such as a camera 13, as described above.

The bracket 1, which is machined from a single piece of metal such as aluminium or an aluminium alloy, has a base flange 2. Two side flanges 3 extend perpendicularly from the base flange 2. Each side flange is reinforced by a pair of strengthening buttresses 4. The two side flanges are joined at their distal ends by a top plate 5 which is cantilevered at one end 6 to extend forwardly beyond the base flange.

Figure 3:
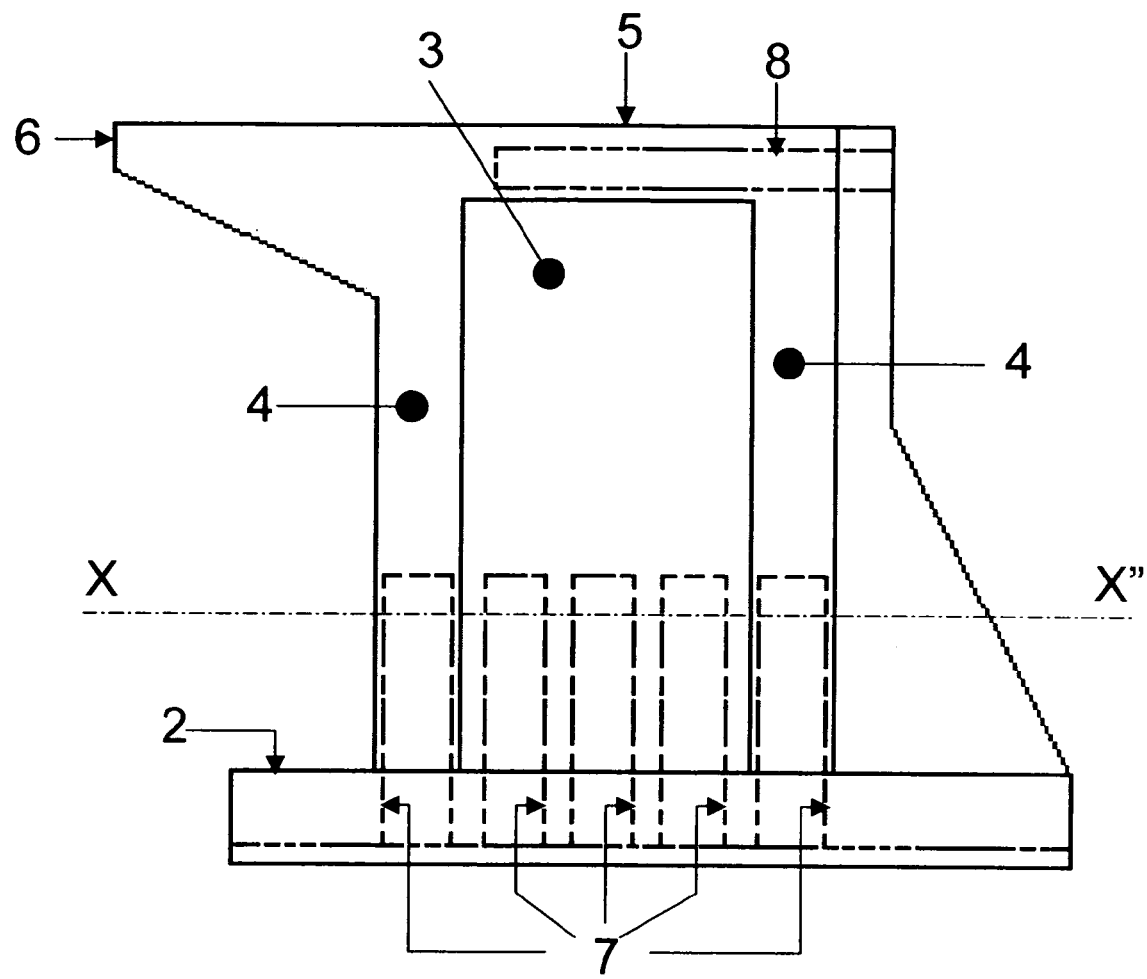
FIG. 3 shows a side elevation of the bondhead bracket of FIG. 2, looking in the direction of arrow A of FIG. 2.
Figure 4:
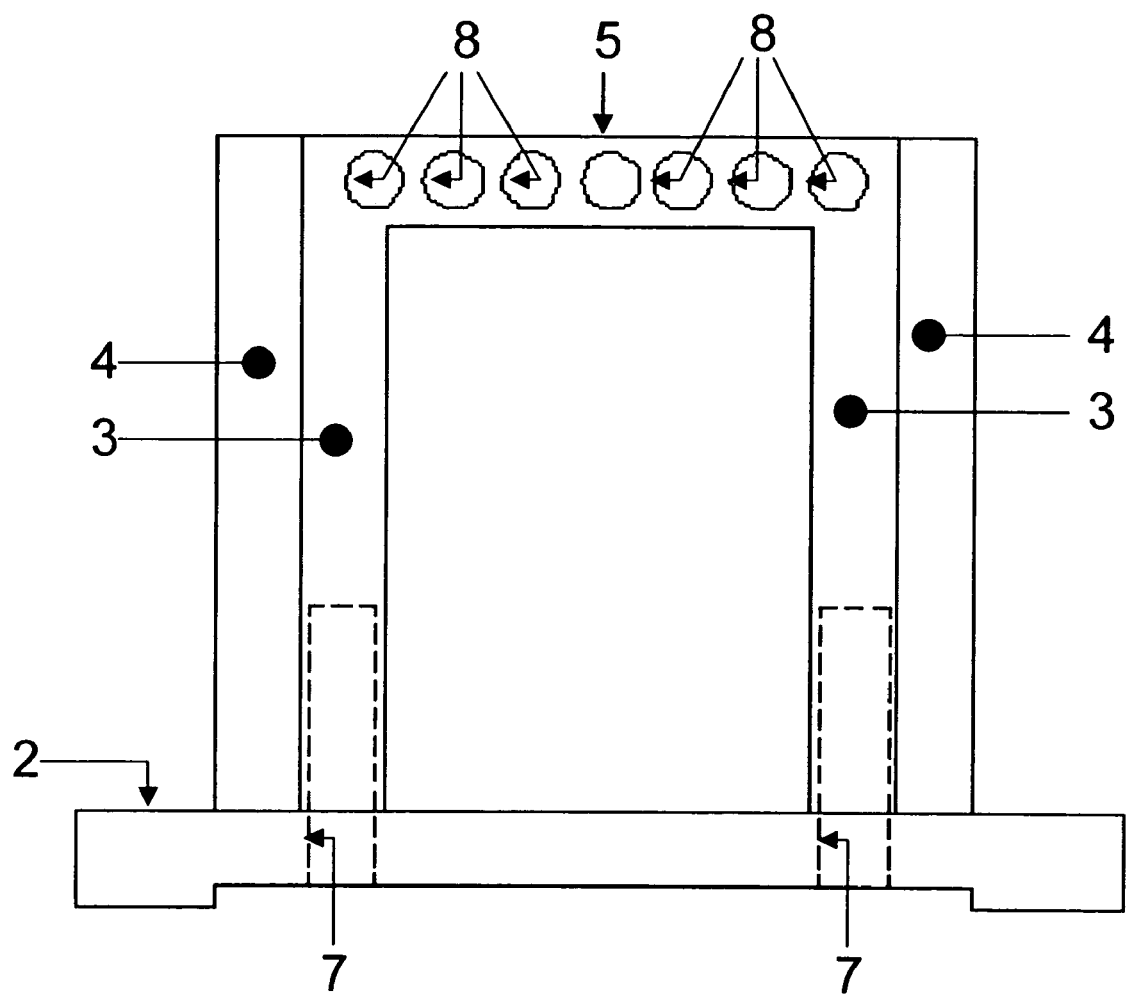
FIG. 4 shows a rearward end elevation of the bondhead bracket of FIG. 3, looking in the direction of arrow B in FIG. 2.
Figure 5:
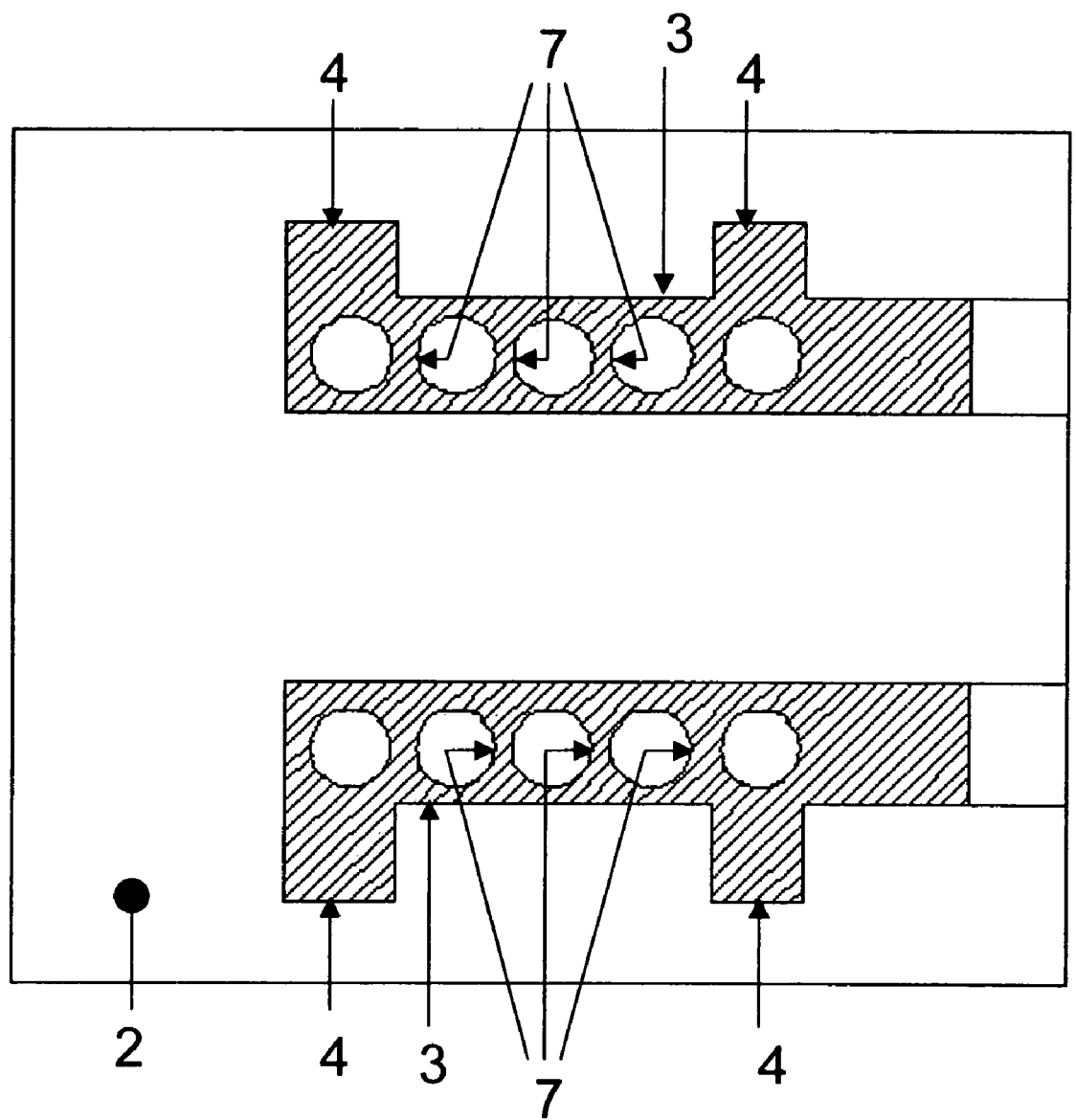
FIG. 5 shows a cross-sectional plan view of the bondhead bracket, taken looking down at line X-X' of FIG. 3.

Holes 7, seen end-on in the cross-sectional plan view of FIG. 5, and shown by broken lines in the side and end elevations of FIGS. 3 and 4, are drilled in each side flange 3 from the underside of the base flange 2.

Holes 8, seen end-on in the rearward view of FIG. 4, and shown by broken lines in the side elevation of FIG. 3, are drilled into the top plate 5 from its rearward end.

The holes 7, 8 are filled with a rubber composition (not shown). The preferred composition is a butyl rubber loaded with carbon particles.

It is known for such brackets to be provided with such holes, as described above, to reduce the bracket weight and thus improve the speed at which the wirebonder can be effectively operated. Where such holes are present, it is convenient to add the rubber composition to these holes.

In one embodiment of the invention, the addition of the rubber composition to a bracket machined from aluminium increased the weight of the bracket by about 10%. If necessary, the added weight of the rubber composition can be compensated, at least in part, by manufacturing the bracket from a lighter material, for example, an aluminium-lithium alloy in the embodiment cited.

In cases where there are no suitable holes already provided, holes can be provided expressly for the purpose of accommodating the rubber composition. The holes can be provided by any suitable method, for example by drilling. Suitable locations for the holes may be pre-determined by using finite element analysis to predict the damping behaviour of the filled cavities on the bracket. In particular, locations are sought which have relatively fewer lines of force passing through them. This is because where there is a high density of lines of forces, structural stiffness is required. Structural stiffness is therefore reduced if holes are made in the structure where there is a relatively higher density of lines of force.

Furthermore, locations are also sought where higher stress is expected to be encountered. Such locations would be most susceptible to damping.

Finite element analysis may be performed using commercially-available computer-aided tools such as ANSYS™ and ABAQUS™. It is preferred that locations having the aforementioned characteristics are found before the cavities are formed so as to maximise the effects of damping.

Figure 6:
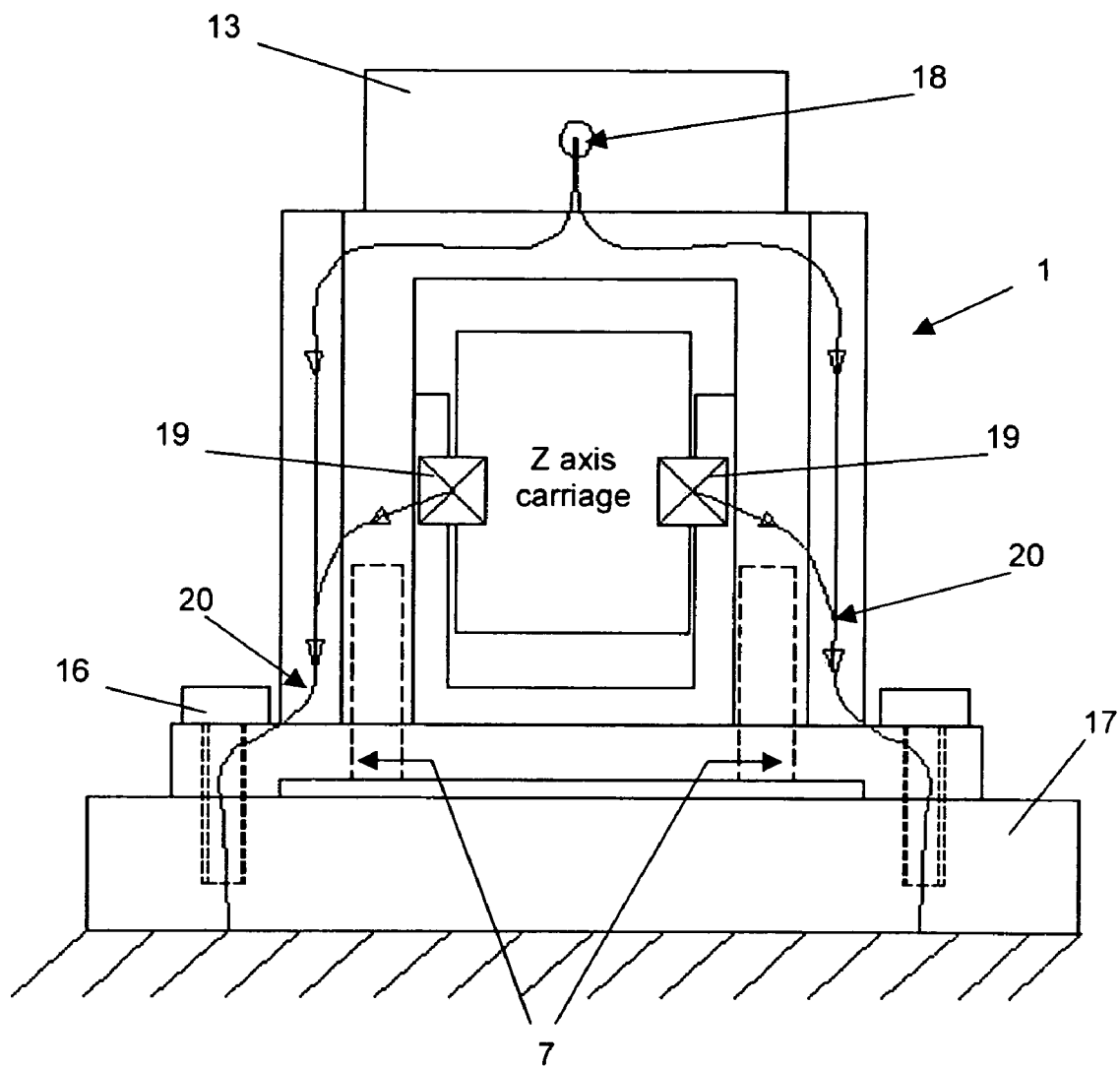
FIG. 6 shows a front end elevation of the bondhead bracket of FIG. 3 with representations of lines of force passing through the bracket.

FIG. 6 shows a front end elevation of the bondhead bracket of FIG. 3 with representations of lines of force passing through the bracket 1. Principal areas where forces are generated on the bracket 1 are the Z axis carriage (supporting components such as the ultrasonic transducer 11 and wire clamp assembly 12) and the centre of gravity 18 of the camera 13. The Z axis carriage is mounted to the bracket 1 by bearings 19. Lines of force 20 originating from the centre of gravity 18 of the camera 13 and bearings 19 are found using the methods described above. The lines of force 20 are transmitted through the bracket 1 down through the screws 16 affixing the bracket 1 to the support base 17. As shown in FIG. 6, the cavities 7 are preferably formed in a location where the primary lines of force 20 are avoided.

In one embodiment, after suitable locations are determined and cylindrical holes are formed in the bracket, the rubber composition is cast in the form of cylindrical rods which are then inserted into the cylindrical holes in the bracket.

In another embodiment, the rubber composition is injection moulded directly in the cavities. In this case, the rubber composition is injected as a fluent powder into the cavities and cured in the cavities.

The cavities are preferably provided with vent holes (not shown in the Figures), for example at the blind ends of the cavities, to allow air to escape during introduction of the rubber composition into the cavities. By allowing for the escape of air from the cavities, the rubber composition may be introduced smoothly and with little likelihood of air pockets remaining. As explained below, air pockets degrade the damping performance. When loading the cavities by injection of a fluent composite material, the appearance of the composite material exiting from the vent holes can be used as an indication that the cavities are substantially filled and that further injection of material can cease.

The degree of vibration damping is dependent upon the interfacial bond between the bracket and the rubber composition. The bond, and the degree of damping, may be enhanced by using an adhesive to bond the cast rods to the walls of the cavities in the bracket.

Improvement in the bond between composition and bracket, and the resulting damping, can also be enhanced by cleaning the cavity walls, for example by plasma cleaning or ultrasonic washing, to remove oxides or other surface contaminants.

Improvement in the bond between composition and bracket, and the resulting damping, can also be enhanced by providing the cavity walls with a surface texture, by roughening the surface, for example by etching, or by forming screw threads or other formations on the cavity walls. The rubber composition engages the surface texture or formations to mechanically couple more intimately with the bracket and thus provide an enhanced damping effect.

Air gaps or voids in the rubber composition degrade the damping effect by reducing the mechanical coupling between the bracket and the total mass of the rubber composition. In particular, air gaps or voids between the bracket and the cavity walls degrade the damping effect.

A preferred rubber composition is butyl rubber loaded with carbon particles. In one embodiment, 60% of the weight of the composite material is provided by the carbon particles. In a preferred embodiment 20% of the weight of the composite material is provided by the carbon particles.

The cavities may be partially filled but are preferably completely filled.

Improvements of up to 50% in the damping of vibrations have been validated by shaker tests on the bondhead bracket, and improvements of about 5 dB at peaks in the amplitude-frequency plots have been shown by sine sweep tests on the full XY wirebonder table.

By damping vibrations in the bondhead bracket, vibrations originating in the Z-axis assembly are dampened before being transmitted on to the XY table, thus improving the final positioning accuracy and reducing the settling time of vibrations of the wire bonder.

The foregoing describes the invention including a preferred embodiment thereof which is described by way of example only. Alterations and modifications, as will be obvious to those skilled in the art, are intended to be incorporated within the scope hereof as defined in the accompanying claims.

The invention claimed is:

1. A method of damping vibrations in a support structure adapted for supporting a component which is drivable to move in at least one direction during use, and is subject to vibration in the at least one direction of such movement due to forces transmitted through the support structure, such forces being distributed in the support structure in regions of high force density and regions of relatively lower force density, the method including the steps of:
   providing a carriage mechanism to the support structure operable to move and position the component during use;
   providing a cavity in the support structure;
   positioning the cavity entirely within a portion of the support structure which experiences a relatively lower density of transmitted forces than other regions; and
   at least partially filling the cavity with a composite material.

2. A method of damping vibrations as claimed in claim 1, wherein the composite material includes butyl rubber loaded with carbon particles.

3. A method of damping vibrations as claimed in claim 1, wherein not more than 60% of the weight of the composite material is carbon particles.

4. A method of damping vibrations as claimed in claim 1, wherein approximately 20% of the weight of the composite material is carbon particles.

5. A method of damping vibrations as claimed in claim 1, further including the step of determining a position for the cavity using finite element analysis.

6. A method of damping vibrations as claimed claim 1, wherein the composite material is bonded to the cavity walls.

7. A method of damping vibrations as claimed in claim 6, wherein composite material is bonded to the cavity walls by an adhesive material.

8. A method of damping vibrations as claimed in claim 6, wherein the cavity walls are provided with a surface texture and the composite material is bonded to the cavity walls by engaging the surface texture on the cavity walls.

9. A method of damping vibrations as claimed in claim 1, wherein the cavity is completely filled with the composite material.

10. A method of damping vibrations as claimed in claim 1, wherein the cavity is a substantially cylindrical hole in the support structure.

11. A method of damping vibrations as claimed in claim 1, wherein the cavity is a drilled hole in the support structure.

12. A method of damping vibrations as claimed in claim 1, wherein the cavity is an open cavity.

13. A method of damping vibrations as claimed in claim 1, wherein the cavity is filled with a composite material that is first cast as a substantially cylindrical rod and then inserted into the respective cavity.

14. A method of damping vibrations as claimed in claim 1, wherein the composite material is injected in a fluent state into the cavity which acts as a mold to form the shape of the composite material which solidifies in the cavity.

15. A method of damping vibrations as claimed in claim 1, wherein the support structure is a wirebonder bracket.

16. A method as claimed in claim 1, wherein the cavity is in a region of the support structure which experiences a higher level of stress resulting from movement of the component than another region.

17. An apparatus comprising:
   a support structure;
   a component mounted on the support structure;
   a carriage mechanism mounted to the support structure for moving and positioning the component,
   wherein the carriage mechanism is operable to move the component in at least one direction during use, and
   the component is subject to vibration in the at least one direction of such movement due to forces transmitted through the support structure,
   such forces being distributed in the support structure in regions of high force density and regions of relatively lower force density; and
   a vibration damper for reducing vibration in the component in at least the one direction during such use, the vibration damper comprising a cavity in the support structure positioned entirely within a location which experiences a relatively lower density of transmitted forces than other locations,
   wherein the cavity is at least partially filled with a composite material.

18. An apparatus as claimed in claim 17, wherein the cavity is in a region of the support structure which experiences a higher level of stress resulting from movement of the component than another region.

19. An apparatus as claimed in claim 17, wherein the composite material includes butyl rubber loaded with carbon particles.

20. An apparatus as claimed in claim 17, wherein not more than 60% of the weight of the composite material is carbon particles.

21. An apparatus as claimed in claim 17, wherein approximately 20% of the weight of the composite material is carbon particles.

22. An apparatus as claimed in claim 17, wherein the position for the cavity is determined using finite element analysis.

23. An apparatus as claimed in claim 17, wherein the composite material is bonded to the cavity walls.

24. An apparatus as claimed in claim 23, wherein the composite material is bonded to the cavity walls by an adhesive material.

25. An apparatus as claimed in claim 23, wherein the cavity walls are provided with a surface texture and the composite material is bonded to the cavity walls by engaging the surface texture on the cavity walls.

26. An apparatus as claimed in claim 17; wherein the cavity is completely filled with the composite material.

27. An apparatus as claimed in claim 17, wherein the cavity is a substantially cylindrical hole in the support structure.

28. An apparatus as claimed in claim 17, wherein the cavity is a drilled hole in the support structure.

29. An apparatus as claimed in claim 17, wherein the cavity is an open cavity.

30. An apparatus as claimed in claim 17, wherein the cavity is filled with a composite material that is first cast as a substantially cylindrical rod and then inserted into the respective cavity.

31. An apparatus as claimed in claim 17, wherein the composite material is injected in a fluent state into the cavity which acts as a mold to form the shape of the composite material which solidifies in the cavity.

32. An apparatus as claimed in claim 17, wherein the support structure is a wirebonder bracket.

33. A method of damping vibrations in a support structure adapted for supporting a component which moves in at least one direction during use of the component, and is subject to vibration in the at least one direction of such movement, the method including the steps of:
   providing a carriage mechanism to the support structure operable to move and position the component during use;
   providing a cavity in the support structure positioned entirely within a region of the support structure which experiences a relatively higher level of stress than other regions when a component mounted on the support structure moves during use of the component, and at least partially filling the cavity with a composite material.

34. A method of damping vibrations in a wirebonder bracket adapted for supporting a bondhead which moves in at least one direction during its use, and is subject to vibration in the at least one direction of such movement due to forces transmitted through the wire bonder bracket, such forces being distributed in the wire bonder bracket in regions of high force density and regions of relatively lower force density, the method including the steps of:
   providing a carriage mechanism to the wire bonder bracket operable to move and position the bondhead during use;
   providing at least one cavity in the wire bonder bracket positioned entirely within a region of the wire bonder bracket which experiences a relatively lower level of transmitted forces flowing in the wire bonder bracket than other regions; and
   at least partially filling the cavity with a composite material.

35. An apparatus comprising
   a support structure adapted for supporting a component which moves in at least one direction during use, and is subject to vibration in the at least one direction of such movement;
   a carriage mechanism mounted to the support structure for moving the component,
   wherein the support structure includes a vibration damper,
   the vibration damper being provided by a cavity in the support structure positioned entirely within a location experiencing a relatively higher level of stress than at other locations resulting from forces transmitted from a component mounted thereon when the component moves during use, the cavity being at least partially filled with a composite material.

36. An apparatus comprising:
   a wire bonder bracket;
   a bondhead movably supported on the wire bonder bracket whereby the bondhead is movable in at least one direction during its use, and is subject to vibration in the at least one direction of such movement due to forces transmitted through the support structure, such forces being distributed in the support structure in regions of high force density and regions of relatively lower force density;
   a carriage mechanism mounted to the support structure for moving the bondhead, and
   a vibration damper, the vibration damper comprising a cavity in the wirebonder bracket, the cavity being positioned entirely within a location which experiences a relatively lower density of transmitted forces than other locations, the cavity being at least partially filled with a composite material.

* * * * *